(12) United States Patent
Desineni et al.

(10) Patent No.: US 10,191,112 B2
(45) Date of Patent: Jan. 29, 2019

(54) EARLY DEVELOPMENT OF A DATABASE OF FAIL SIGNATURES FOR SYSTEMATIC DEFECTS IN INTEGRATED CIRCUIT (IC) CHIPS

(71) Applicant: GLOBALFOUNDRIES INC., Grand Cayman (KY)

(72) Inventors: Rao Desineni, Malta, NY (US); Atul Chittora, Clifton Park, NY (US); Yan Pan, Clifton Park, NY (US); Sherwin Fernandes, Clifton Park, NY (US); Thomas Herrmann, Radebeul (DE)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/355,256

(22) Filed: Nov. 18, 2016

(65) Prior Publication Data

US 2018/0143248 A1    May 24, 2018

(51) Int. Cl.
*G01R 31/00* (2006.01)
*G01R 31/317* (2006.01)
*G01R 31/3177* (2006.01)

(52) U.S. Cl.
CPC ... *G01R 31/31703* (2013.01); *G01R 31/3177* (2013.01); *G01R 31/31718* (2013.01)

(58) Field of Classification Search
None
See application file for complete search history.

(56) References Cited

U.S. PATENT DOCUMENTS 5,515,384 A    5/1996 Horton, III
7,509,551 B2   3/2009 Koenemann et al.
(Continued)

FOREIGN PATENT DOCUMENTS

CN    104736962 A    6/2015
JP    3111931 B2    11/2000
(Continued)

OTHER PUBLICATIONS

Ralf Buengener et al., "Process Window Centering for 22 nm Lithography", IEEE ASMC 2010, pp. 174-178.
Puneet Gupta et al., "Yield Analysis and Optimization", Unknown Publication Date, pp. 1-28.
Jean-Christophe LeDenmat et al., "Fast Detection of Manufacturing Systematic Design Pattern Failures Causing Device Yield Loss", ResearchGate, SPIE Advanced Lithography Conference, Mar. 2015, pp. 1-9.

(Continued)

*Primary Examiner* — Daniel McMahon
(74) *Attorney, Agent, or Firm* — Gibb & Riley, LLC; Francois Pagette

(57) ABSTRACT

Disclosed are embodiments of a method that provides for pre-production run development of a fail signature database, which stores fail signatures for systematic defects and corresponding root causes. The fail signatures in the database is subsequently accessed and used for a variety of purposes. For example, the fail signatures are evaluated and, based on the results of the evaluation, actions are taken to prevent specific systematic defects from occurring during production runs and/or to allow for early detection of specific systematic defects during production runs. In some embodiments, following production runs, new fail signatures from failing production chips are developed and compared against the fail signatures in the fail signature database. In some embodiments, when a signature match indicates that a particular production chip has a same systematic defect with a same root cause as a particular prototype chip in-line advanced process control (APC) is performed.

14 Claims, 6 Drawing Sheets

(56) References Cited

U.S. PATENT DOCUMENTS

| | | | |
|---|---|---|---|
| 7,646,906 B2 | 1/2010 | Saidin et al. | |
| 7,853,848 B2 | 12/2010 | Desineni et al. | |
| 8,045,785 B2 | 10/2011 | Kitamura et al. | |
| 2004/0009616 A1* | 1/2004 | Huisman | H01L 22/20 438/5 |
| 2009/0106614 A1* | 4/2009 | Desineni | G01B 31/318321 714/732 |
| 2012/0259570 A1 | 10/2012 | Zhang et al. | |
| 2012/0259574 A1* | 10/2012 | Hu | H01L 22/20 702/117 |
| 2015/0363537 A1* | 12/2015 | Kekare | G06F 17/5081 716/112 |
| 2017/0168112 A1* | 6/2017 | Redburn | G01R 31/3177 |
| 2017/0220706 A1* | 8/2017 | Orbon | G06Q 50/01 |

FOREIGN PATENT DOCUMENTS

| | | |
|---|---|---|
| TW | 201610731 A | 3/2016 |
| WO | 2012036666 A1 | 3/2012 |

OTHER PUBLICATIONS

Taiwanese Application No. 106116865, Examination report dated Oct. 1, 2018, including attached Search Report dated Sep. 17, 2018, pp. 1-7.

\* cited by examiner

EARLY DEVELOPMENT OF A DATABASE OF FAIL SIGNATURES FOR SYSTEMATIC DEFECTS IN INTEGRATED CIRCUIT (IC) CHIPS

FIELD OF THE INVENTION

The present invention relates to yield limiting design systematics in integrated circuit (IC) chips and, more particularly, to early (e.g., pre-production) development of a database of fail signatures for systematic defects in integrated circuits and various uses for the database.

BACKGROUND

More specifically, in integrated circuit (IC) chip manufacturing, meeting yield goals is important for avoiding waste, ensuring profitability, etc. For purposes of this disclosure, yield refers to the ratio of the number of production chips of a given design that pass final testing to the total number of production chips manufactured in a given production lot. Additionally, for purposes of this disclosure, a production chip refers to a chip that is manufactured with the intent to sell the chip or incorporate the chip into a product, a passing production chip is a chip that meets required performance parameters so that it can be sold or incorporated into a product, and a failing production chip is a chip that fails to meet the required performance parameters. Meeting yield goals can, however, be difficult with new designs during early production runs due to a failure to identify systematic defects resulting from never before seen layout topologies and/or foundries that do not fully comply with process design kit (PDK) specifications.

SUMMARY

In view of the foregoing, disclosed herein is a method that provides for early development and, particularly, pre-production run development of a fail signature database, which stores fail signatures for systematic defects found on prototype chips along with corresponding root causes of those systematic defects. The fail signatures in the fail signature database can subsequently be accessed and used for a variety of purposes. For example, the fail signatures can be evaluated and, based on the results of the evaluation, actions can be taken to prevent specific systematic defects from occurring during production runs (e.g., design and/or process specification adjustments can be made) and/or actions can be taken to allow for early detection of specific systematic defects during production runs (e.g., in-line level-specific inspections can be performed). Furthermore, following production runs, new fail signatures from failing production chips can be developed and compared against the fail signatures in the fail signature database. In this case, a signature match can be indicative of a particular production chip having a same systematic defect with a same root cause as a particular prototype chip and, based on such a signature match, in-line advanced process control (APC) can be performed.

Generally, the method disclosed herein includes, prior to manufacturing production chips in an initial production run, developing a fail signature database. This fail signature database can store fail signatures and corresponding root causes associated with systematic defects. The systematic defects can be systematic defects that were previously identified on failing prototype chips, which were manufactured according to a specific design, and the corresponding root causes of those systematic defects can be root causes that were previously determined given different process specifications used to form at least some of the prototype chips. Such a fail signature database can be used for prevention and/or detection of specific systematic defects in production chips that are subsequently manufactured according to the same specific design and using a particular set of process specifications (i.e., using the same process specifications for all chips).

More specifically, the method disclosed herein includes, prior to manufacturing production chips in an initial production run, developing a fail signature database. This fail signature database can be developed by manufacturing prototype chips according to a specific design and such that different process specifications are used to form at least some of the prototype chips. The prototype chips can then be dispositioned (i.e., the prototype chips can be tested electrically and, based on the results of the testing, sorted into groups of passing prototype chips and failing prototype chips). Furthermore, during the dispositioning process, failing prototype chips with systematic defects can be identified. Then, fail signatures can be developed for the systematic defects, wherein each fail signature indicates test results associated with a particular systematic defect on a particular failing prototype chip. Additionally, corresponding root causes for the systematic defects can be hypothesized. Specifically, each root cause of each particular systematic defect on each particular failing prototype chip can be hypothesized based on the test results and also on the specific process specifications used during formation of the design level(s) that contain the particular systematic defect on that particular failing prototype chip. The fail signatures with their corresponding root causes can then be stored in the fail signature database. The method further includes using the fail signature database for prevention and/or detection of specific systematic defects in production chips that are subsequently manufactured according to the specific design and using a particular set of process specifications (i.e., using the same process specifications for all chips).

Even more specifically, the method disclosed herein includes, prior to manufacturing production chips in an initial production run, developing a fail signature database. This fail signature database can be developed by manufacturing prototype chips according a specific design. Additionally, during manufacturing of the prototype chips, at least one lithography learning technique (e.g., focus exposure matrix (FEM) development, process window qualification (PWQ) and/or process window centering (PWC)) can be performed such that, for each of multiple selected design levels, different lithographic process specifications are used to form at least some of the prototype chips. The prototype chips can then be dispositioned (i.e., the prototype chips can be tested electrically and, based on the results of the testing, sorted into groups of passing prototype chips and failing prototype chips). Furthermore, during dispositioning, failing chips with systematic defects can be identified. Then, fail signatures can be developed for the systematic defects, wherein each fail signature indicates test results associated with a particular systematic defect on a particular failing prototype chip. Additionally, corresponding root causes for the systematic defects can be hypothesized. Specifically, each root cause of each particular systematic defect on a particular failing prototype chip can be hypothesized based on the test results and also on the specific lithographic process specifications used during formation of the particular design level(s) that contain the particular systematic defect on that particular failing prototype chip. The fail signatures with their corresponding root causes can then be stored in the fail signature database. The method further includes using the fail signature database for prevention and/or detection of specific systematic defects in production chips that are subsequently manufactured according to the specific design and using a particular set of process specifications (i.e., using the same process specifications for all chips).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
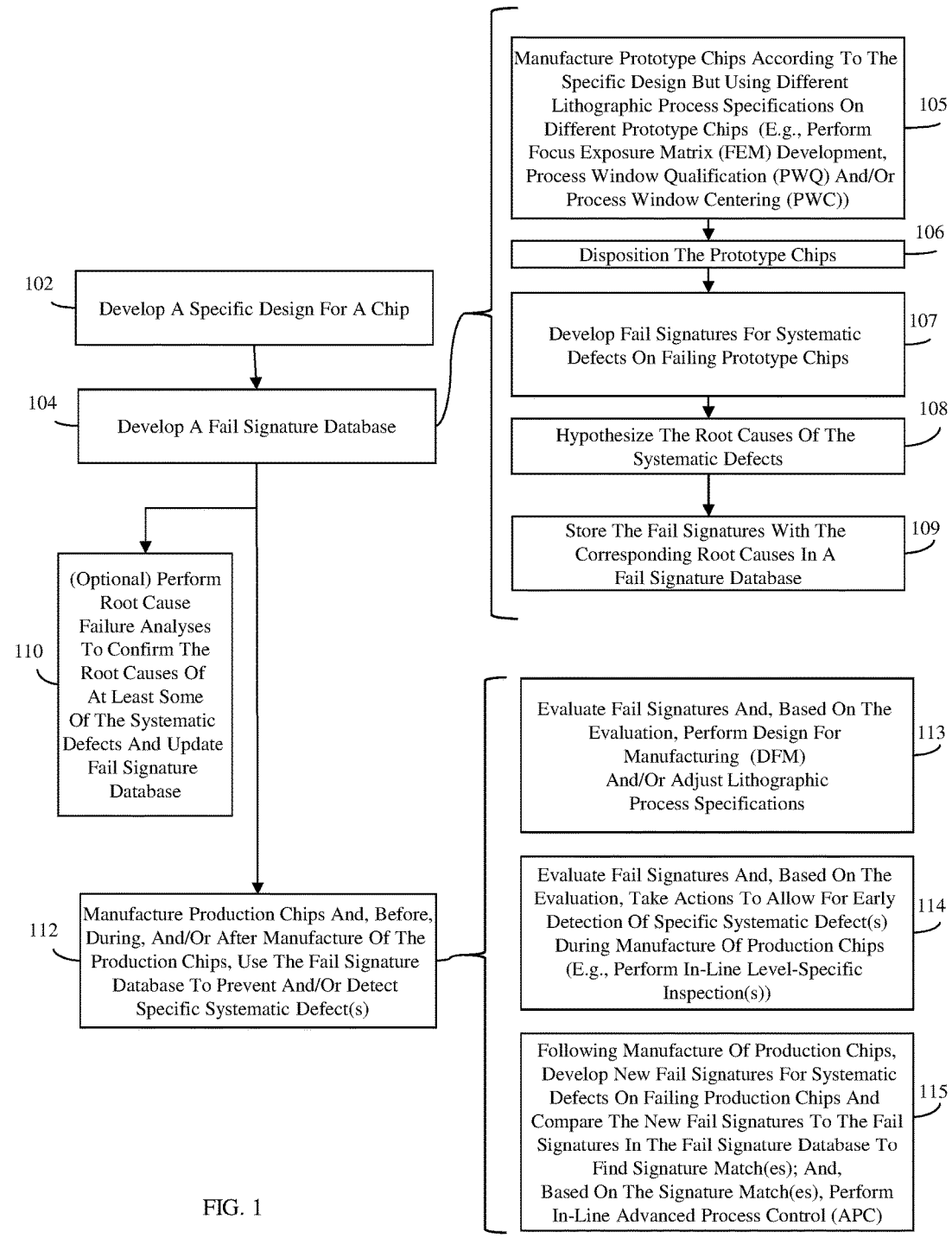
FIG. 1 is a flow diagram illustrating methods that provide for pre-production run development of a fail signature database and for using such a fail signature database.

As mentioned above, in integrated circuit (IC) chip manufacturing, meeting yield goals is important for avoiding waste, ensuring profitability, etc. For purposes of this disclosure, yield refers to the ratio of the number of production chips of a given design that pass final testing to the total number of production chips manufactured in a given production lot. Additionally, for purposes of this disclosure, a production chip refers to a chip that is manufactured with the intent to sell the chip or incorporate the chip into a product, a passing production chip is a chip that meets required performance parameters so that it can be sold or incorporated into a product, and a failing production chip is a chip that fails to meet the required performance parameters. Meeting yield goals can, however, be difficult with new designs during early production runs due to a failure to identify systematic defects resulting from never before seen layout topologies and/or foundries that do not fully comply with process design kit (PDK) specifications.

Various techniques are currently used in an attempt to mitigate the risk of low yield during an initial production run for a new design. For example, lithography learning methods such as focus exposure matrix (FEM) and/or process window qualification (PWQ) can be performed during a prototype production run. In FEM, prototype chips are formed in an array on a wafer with each prototype chip in the array being formed using a different combination of focus and dose (also referred to as exposure) specifications. In this case, selected sites on the prototype chips are subjected to in-line optical inspection and, particularly, critical dimension measuring and scanning electron microscope (SEM) imaging to determine critical dimension (CD) and pattern printability. In PWQ, prototype chips are formed on semiconductor wafers and, particularly, the prototype chips formed on a given wafer are formed with variations in the focus, the dose or the overlay specifications. In this case, in-line optical inspections and, particularly, bright field inspections (BFIs) are performed to detect systematic defects (i.e., process variation-induced defects and, particularly, defects that can be attributed to a process variation). Given the detected CD and pattern printability from FEM and the detected systematic defects from PWQ, limits can be established on the lithography process specifications to be used during the initial production run to avoid defects.

Unfortunately, in-line optical inspections, such as bright field inspections (BFIs), may not be sufficiently sensitive to detect all defects. Thus, some defects and, particularly, some systematic defects may be missed during the in-line optical inspections of the prototype chips such that the lithography process specifications established for use during the initial production run are not optimal. As a result, a significant number of production chips from the initial production run may still fail when wafers are tested and sorted at electrical wafer sort (EWS) (also referred to as wafer-level chip dispositioning) or when individual chip packages are tested and sorted at final test (FT) (also referred to as module-level chip dispositioning). Consequently, yield for the initial production run may be relatively low.

In view of the foregoing, disclosed herein is a method that provides for early development and, particularly, pre-production run development of a fail signature database, which stores fail signatures for systematic defects found on prototype chips along with corresponding root causes of those systematic defects. The fail signatures in the fail signature database can subsequently be accessed and used for a variety of purposes. For example, the fail signatures can be evaluated and, based on the results of the evaluation, actions can be taken to prevent specific systematic defects from occurring during production runs (e.g., design and/or process specification adjustments can be made) and/or actions can be taken to allow for early detection of specific systematic defects during production runs (e.g., in-line level-specific inspections can be performed). Furthermore, during production runs, new fail signatures from failing production chips can be developed and compared against the fail signatures in the fail signature database. In this case, a signature match can be indicative of a particular production chip having a same systematic defect with a same root cause as a particular prototype chip and, based on such a signature match, in-line advanced process control (APC) can be performed.

More particularly, FIG. 1 is a flow diagram illustrating the method disclosed herein. The method can include developing a specific design for an integrated circuit (IC) chip (102). Specifically, an initial design for an integrated circuit (IC) chip can be developed. This initial design can be represented by a high-level description, which sets out the requirements for the IC chip. This high-level description can be stored in memory in, for example, a hardware description language (HDL), such as VHDL or Verilog. Following development of the initial design, physical design processes can be performed in order to generate a design layout for the IC chip. These physical design processes can include, but are not limited to, logic synthesis, floorplanning, power planning and input/output pin placement, library element placement, clock tree synthesis and wire routing. Such physical design processes are well known in the art and, thus, the details of those processes are omitted form this specification in order to allow the reader to focus on the salient aspects of the disclosed method. The design layout for the IC chip can be stored in memory and subsequently used in the development of a design layout for a semiconductor wafer onto which multiple instances of the IC chip will be formed.

Figure 2:
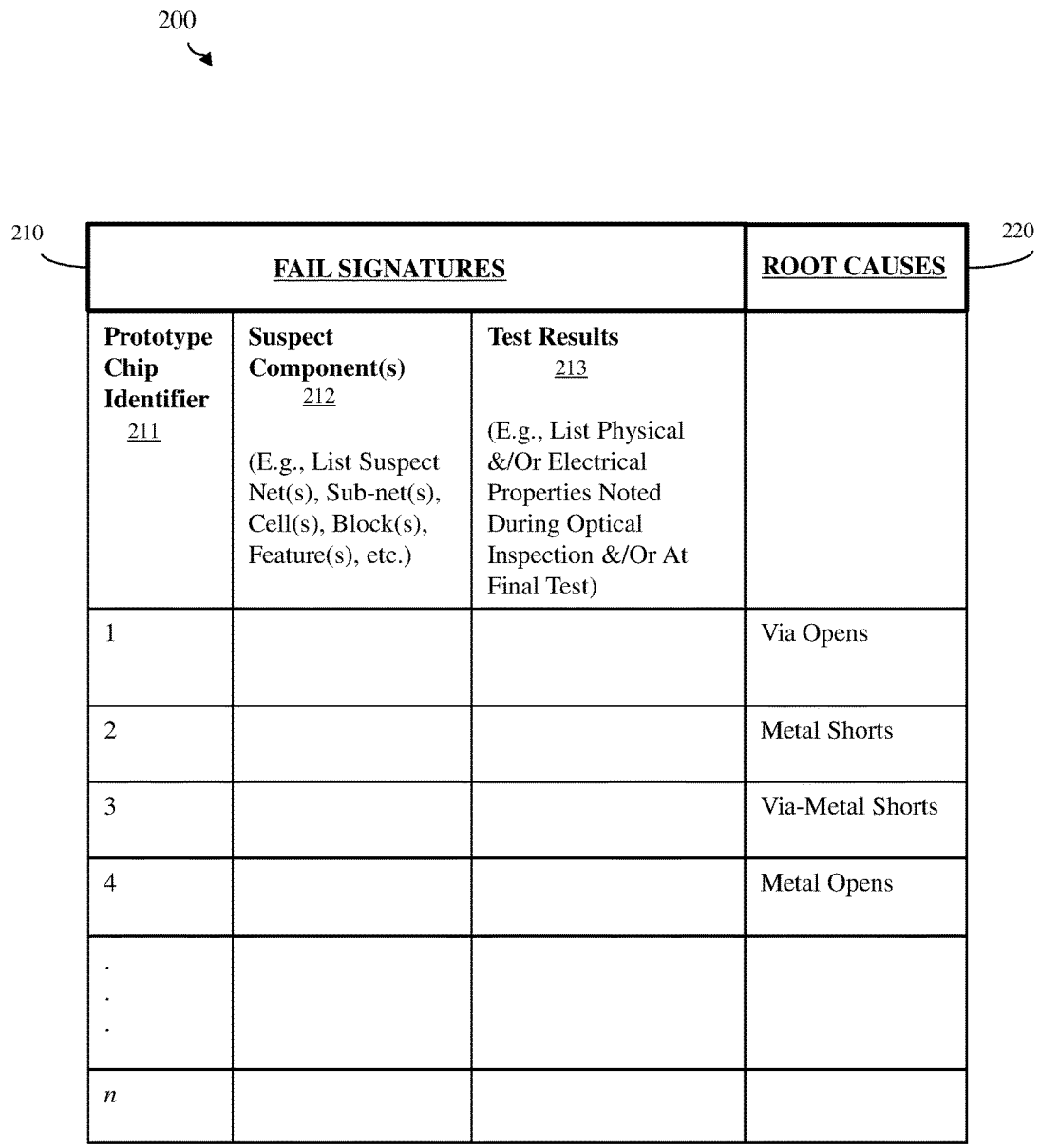
FIG. 2 is a table illustrating an exemplary fail signature database developed and used according to the methods of FIG. 1.

The method can further include developing a fail signature database and doing so prior to performing the initial production run (i.e., before any production chips are manufactured with the intent to sell or incorporate into products) (104). As illustrated in FIG. 2, the fail signature database 200 can store fail signatures 210 for systematic defects. Each fail signature 210 can include: an identifier 211 for the particular failing prototype chip; the test results 213 that warranted the fail disposition and that, thereby, indicate the occurrence of the particular systematic defect of the particular failing prototype chips; and an indication of the suspect component(s) 212 (e.g., net(s), cell(s), feature(s), etc.) that may contain the particular systematic defect and that, thereby, caused the fail. Additionally, the fail signature database 200 can further store corresponding root causes 220 for the systematic defects.

In order to develop the fail signature database 200 at process 104 of FIG. 1, a prototype run can be performed (105). That is, prototype chips can be manufactured on one or more wafers according to the specific design, but without the intent to sell or incorporate into products. During this prototype run, one or more design levels to be patterned within the specific design can be selected. The selected design levels can include all of the design levels (e.g., from the semiconductor device level to the last metal level) or a selected few of these design levels. In any case, chip-to-chip modifications can be made in the lithography process specifications used for patterning features in the selected design levels. For example, at least one lithography learning technique can be used during the processing of the selected design levels on the prototype chips such that, for any given one of the selected design levels, different combinations of lithographic process specifications will be used for at least some of the prototype chips. The lithography learning techniques can include, for example, focus exposure matrix (FEM) development, process window qualification (PWQ), process window centering (PWC) and/or any other suitable lithographic learning technique that used different process specifications for the same design level on different prototype chips.

Figure 3:
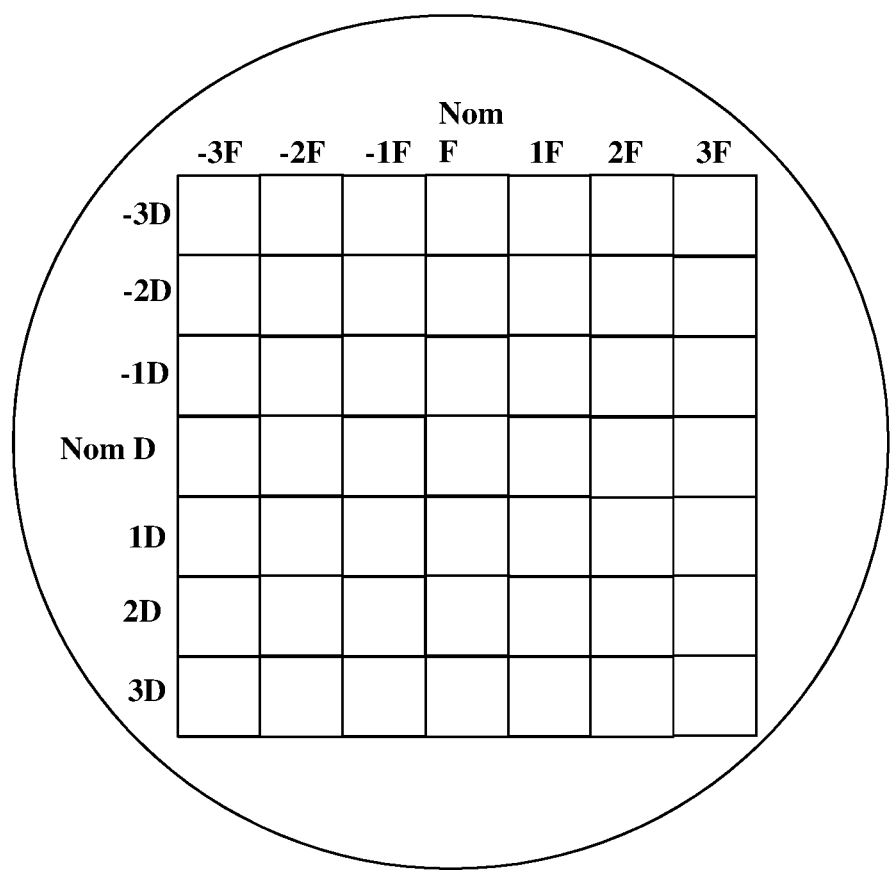
FIG. 3 is a drawing illustrating an exemplary semiconductor wafer fabricated for focus exposure matrix (FEM) development.

More specifically, for FEM development, prototype chips are manufactured in an array of columns and rows on a semiconductor wafer according to the specific design and, particularly, according to the previously determined design layouts for the chip and wafer (e.g., as illustrated in FIG. 3). However, at each selected design level, a photoresist layer that is deposited onto the semiconductor wafer is patterned using different combinations of focus and dose specifications for different ones of the prototype chips being formed on the semiconductor wafer. Specifically, the same dose is used for all prototype chips in a given row, the same focus is used for all prototype chips in a given column, stepped changes in dose are made from row to row and stepped changes in focus are made from column to column. For example, there can be rows for nominal dose minus 3 steps (−3D), nominal dose minus 2 steps (−2D), nominal dose minus 1 step (−1D), nominal dose (ND), nominal dose plus 1 step (1D), nominal dose plus 2 steps (2D), nominal dose plus 3 steps (3D), etc., where a step refers to a given number of units of dosage. Similarly, there can be columns for nominal focus minus 3 steps (−3F), nominal focus minus 2 steps (−2F), nominal focus minus 1 step (−1F), nominal focus (NF), nominal focus plus 1 step (1F), nominal focus plus 2 steps (2F), nominal focus plus 3 steps (3F), etc., where a step refers to a given number of units of focus. In the case of FEM, selected sites on the prototype chips are typically subjected to in-line optical inspection and, particularly, critical dimension measuring and scanning electron microscope (SEM) imaging to determine critical dimension (CD) and pattern printability.

Figure 4:
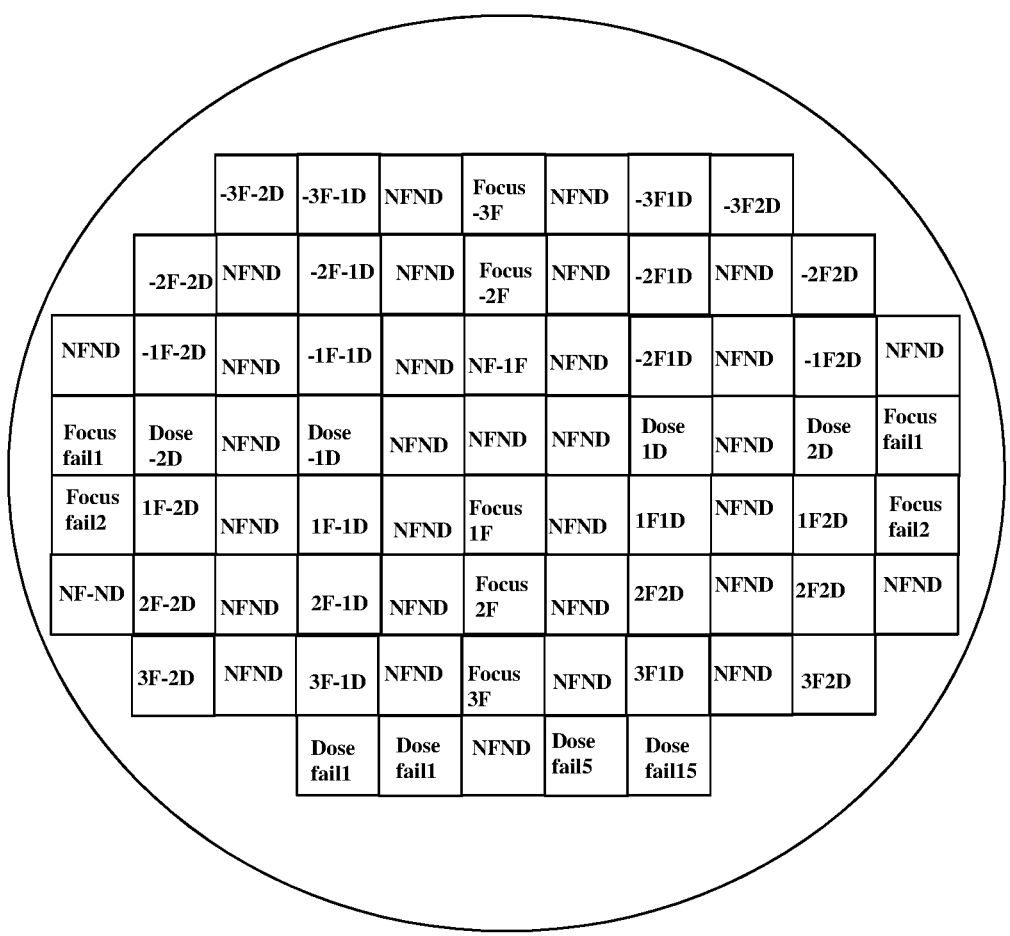
FIG. 4 is a drawing illustrating an exemplary semiconductor wafer fabricated for process window qualification (PWQ)

For PWQ, prototype chips are manufactured in columns and rows on a semiconductor wafer according to the specific design and, particularly, according to the previously determined design layouts for the chip and wafer (e.g., as illustrated in FIG. 4). However, at each selected design level, a photoresist layer that is deposited onto the semiconductor wafer is patterned using different combinations of focus and dose specifications for at least some of the prototype chips being formed on the semiconductor wafer. Specifically, a combination of nominal focus and nominal dose (NFND) specifications is used for various prototype chips across the semiconductor wafer and additional combinations of focus and dose specifications (e.g., −3F−2D, −3F−1D, −3F1D, −3F2D, etc.) are used for other prototype chips across the semiconductor wafer. In the case of PWQ, all of the prototype chips on the semiconductor wafer are typically subjected to in-line optical inspection and, particularly, bright field (BF) inspection to detect defects.

Figure 5A:
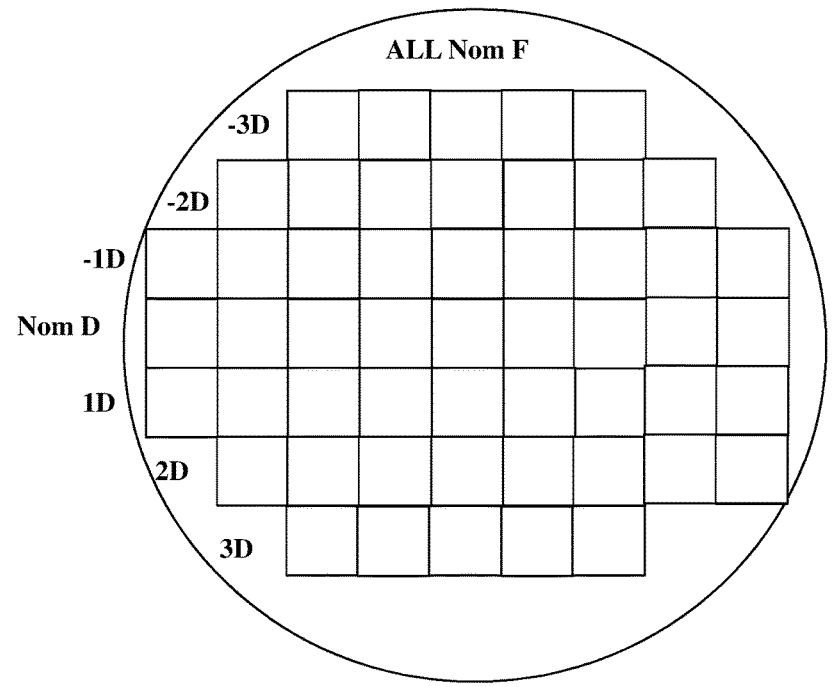
FIGS. 5A and 5B are drawings illustrating exemplary semiconductor wafers fabricated for process window centering (PWC)
Figure 5B:
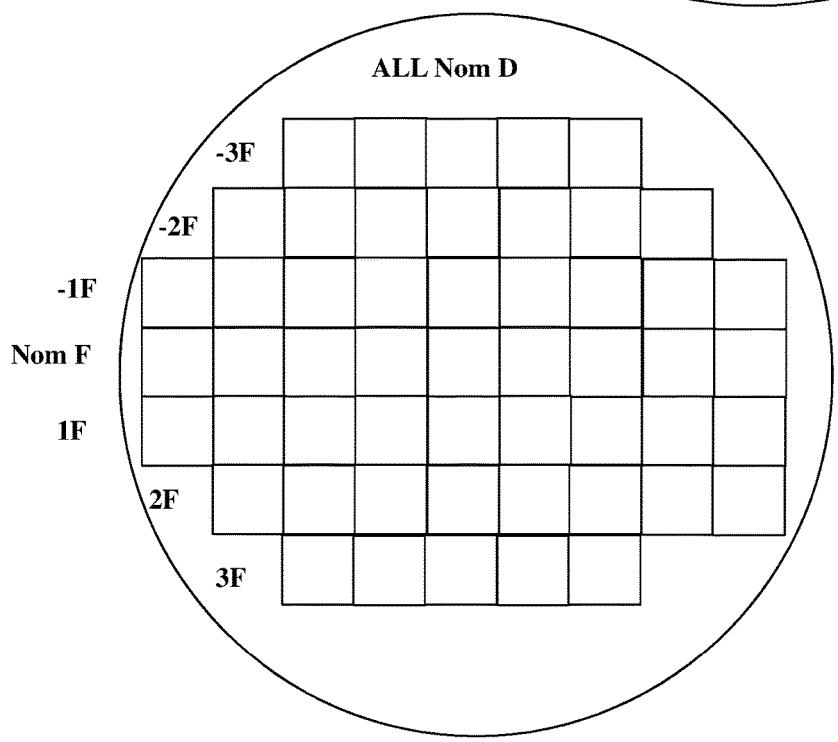

For PWC, prototype chips are manufactured in rows on two semiconductor wafers according to the specific design and, particularly, according to the previously determined design layouts for the chip and wafer (e.g., as illustrated in FIGS. 5A and 5B). However, at each selected design level, a photoresist layer that is deposited onto the semiconductor wafer is patterned using different combinations of focus and dose specifications for at least some of the prototype chips being formed on the semiconductor wafers. Specifically, on the first semiconductor wafer a nominal focus specification (NF) can be used for all prototype chips and stepped changes in the dose specification can be made from row to row (e.g., as shown in FIG. 5A) and on the second semiconductor wafer a nominal dose specification (ND) can be used for all prototype chips and stepped changes in the focus specification can be made from row to row (e.g., as shown in FIG. 5B). In the case of PWC, all of the prototype chips on the semiconductor wafers are typically subjected to in-line optical inspection and, particularly, bright field (BF) inspection to detect defects.

Semiconductor wafers containing prototype chips formed using lithography learning techniques, such as FEM, PWQ and PWC, are typically scrapped following optical inspection of the last design level. However, in the method disclosed herein, instead of scrapping the prototype chips manufactured at process 105, dispositioning is performed (106). Specifically, the prototype chips are tested electrically (at final test) and, based on the results of the testing, sorted into groups of passing prototype chips and failing prototype chips. Furthermore, based on the results of the electrical testing (including any diagnostic information about the nature of the fail logged during testing), the failing prototype chips can further be sorted into failing prototype chips with random defects and failing prototype chips with systematic defects (i.e., failing prototype chips wherein the defect(s) that caused the fail is likely to be systematic). Techniques for testing and sorting chips into groups as described are well known in the art and, thus, the details of these techniques have been omitted from the specification in order to allow the reader to focus on the salient aspects of the disclosed methods.

Next, fail signatures can be developed for each systematic defect on the failing prototype chips (107). Specifically, test results associated with each particular systematic defect on each particular failing prototype chip can be compiled. These test results can include, for example, the results of the optical inspections (e.g., the images captured during optical inspection) and, particularly, any physical properties noted during the optical inspections. The physical properties can be, for example, the shapes and sizes of features (e.g., metal trench shape, width, depth; via shape, diameter, depth; pitch; etc.). These test results can also include the results of the electrical testing (i.e., the results of final test) and, particularly, any electrical properties (e.g., resistance, current, voltage, and/or any other electrical properties) that were exhibited under test and that indicated a fail. These test results can further include any diagnostic information acquired about the nature of the fail logged during testing. Additionally, diagnostic analyses can be performed based on the test results to identify the on-chip component or components (e.g., net(s), cell(s), feature(s), etc.) suspected as containing a particular systematic defect. That is, the diagnostic analyses can be performed to identify, generally, the location of the particular systematic defect and, thereby the particular design level(s) at issue. As illustrated in FIG. 2 and mentioned above, each fail signature 210 can include: an identifier 211 for the particular failing prototype chip; the test results 213 (e.g., physical properties noted during optical inspection and/or electrical properties noted during final test); and an indication of the suspect component(s) 212 (i.e., an indication of the general location of the particular systematic defect). For purposes of illustration, the identifier 211 and suspect component(s) 212 are shown in different columns in the table of FIG. 2; however, it should be understood that, alternatively, a single identifier could be used that identifies both a particular failing prototype chip as well as the suspect component(s) on that chip.

Additionally, corresponding root causes for the identified systematic defects can be determined and, more particularly, hypothesized (108). For purposes of this disclosure, a "root cause" of a systematic defect refers to an explanation for a fail designation. Specifically, the root cause can indicate the type of defect (also referred to as the defect classification) such as a short, a void, or any other defect. The root cause can further indicate the point of occurrence of that defect within the suspect component(s). For example, the root cause of a given failing systematic defect on a given failing prototype chip may be identified as metal shorts (i.e., shorts within the suspect component(s) between adjacent metal lines); via-metal shorts (i.e., shorts within the suspect component(s) between vias and metal lines, above or below); shorts within the suspect component(s) between nodes or subnets; via opens (i.e., voids in the conducting material of vias within the suspect component(s)); metal opens (i.e., voids in the conducting material of metal lines within the suspect component(s)); etc. The root cause of a particular systematic defect on a particular failing prototype chip can be hypothesized based, not only on the test results (including the physical properties noted during optical inspection and/or the electrical properties noted during final test) and on the component(s) suspected of containing the particular systematic defect (i.e., on the general location of the particular systematic defect), but also on the design layout and the specific lithographic process specifications (e.g., the specific focus, specific dose, etc.) used during formation of the particular design level(s) at issue. That is, some defects, such as shorts or voids, can result from patterned features being too close together, patterned features being too far apart, patterned features being too small, patterned features being too large, overlay, etc. Such patterning issues can be due to a lithographic process specification used at a specific design level or a combination of specific lithographic process specifications used at one or more specific design levels. Thus, knowledge of the design layout and the specific lithographic process specification(s) used on a particular design level within which the suspect component(s) are located can be used to hypothesize whether the resulting defect is a short, a void, etc. and where that defect occurs (e.g., between metal lines, between a via and a metal line, within a via, within a metal line, etc.). The fail signatures 210 and their corresponding root causes 220 can then be stored in the fail signature database 200, as mentioned above and illustrated in the table of FIG. 2 (109).

After the fail signature database 200 is developed, production chips (i.e., chips intended for sale or incorporation into products) can be manufactured in production lots, according to the specific design and using a particular set of lithographic process specifications such that, from chip to chip, the same specific combination of lithographic process specifications are used at the same design level (112). It should be noted that the fail signatures 210 in the fail signature database 200 can be accessed and used for a variety of purposes before, during and/or after the manufacture of production chips at process 112.

For example, prior to manufacturing the production chips, the fail signatures 210 in the fail signature database 200 can be accessed and used in order to prevent the occurrence of one or more specific systematic defects in the production chips. Specifically, the fail signatures 210 in the fail signature database 200 can be accessed and evaluated prior to manufacturing the production chips and, based on the results of the evaluation, actions can be taken to prevent at least one specific systematic defect corresponding to at least one specific fail signature in the fail signature database from occurring in the production chips. These actions can include, for any specific systematic defect, making adjustments to the specific design (i.e., performing design for manufacturing (DFM)) and/or making adjustments to the particular set of lithographic process specifications and, particularly, making adjustments to a specific combination of lithographic process specifications used at the specific design level(s) where the specific systematic defect may occur (113).

The fail signatures 210 can also be evaluated prior to manufacturing production chips and, based on the results of the evaluation, actions can be taken during manufacture of the production chips to allow for early detection of at least one specific systematic defect corresponding to at least one specific fail signature in the fail signature database. These actions can include performing a level-specific inspection or weakpoint inspection during manufacture of the production chips to detect a specific systematic defect (114). That is, the potential location of a specific systematic defect (also referred to as a weakpoint) and, particularly, a design level where the specific systematic defect may occur can be inspected early (e.g., during formation of the design level and/or immediately following completion of the design level) to ensure that any such defect that occurs is detected. Such a level-specific or weakpoint inspection may be appropriate where prevention of the specific systematic defect by adjusting the specific design (i.e., by DFM) and/or by adjusting the particular set of lithographic process specifications used for the design level is impractical and where early detection of the occurrence of such a defect may be advisable (e.g., given a catastrophic nature of the specific systematic defect at issue). If the specific systematic defect is detected during the level-specific inspection, the design level(s) at issue can, for example, be reworked and/or the semiconductor wafer can be scrapped to prevent further waste.

Additionally, new fail signatures for systematic defects appearing on failing production chips can be developed and compared against the fail signatures in the fail signature database (115). More specifically, production chips in a production lot can be dispositioned in a manner similar to the prototype chip dispositioning discussed above. That is, the production chips can be tested electrically and, based on the results of the testing, sorted into groups of passing production chips and failing production chips. Furthermore, based on the results of the electrical testing (including any diagnostic information about the nature of the fail logged during testing), the failing production chips can further be sorted into failing production chips with random defects and failing production chips with systematic defects. Techniques for testing and sorting chips into groups as described are well known in the art and, thus, the details of these techniques have been omitted from the specification in order to allow the reader to focus on the salient aspects of the disclosed methods. Then, new fail signatures for systematic defects appearing on the failing production chips can be developed. Specifically, for each failing production chip, test results associated with a systematic defect can be compiled. These test results can include: the results of optical inspections (e.g., images captured during optical inspection) and, particularly, any physical properties (e.g., shapes, sizes, etc.) noted during optical inspections; the results of electrical testing and, particularly, any electrical properties exhibited at final test; and/or any diagnostic information acquired about the nature of the fail logged during testing. Additionally, diagnostic analyses can be performed based on the test results to identify the on-chip component or components (e.g., net(s), cell(s), feature(s), etc.) suspected as containing a systematic defect. That is, the diagnostic analyses can be performed to identify, generally, the location of a systematic defect and, thereby the design level(s) at issue. Like the fail signatures for the failing prototype chips, each new fail signature for each systematic defect on each failing production chip can include: an identifier for the failing production chip; the test results; and an indication of the suspect component(s) (i.e., the general location of the systematic defect).

Then, the new fail signatures of the systematic defects appearing on the failing production chips can be compared to the fail signatures in the fail signature database to find signatures matches. A new fail signature (which is associated with a failing production chip) and a fail signature (which is in the fail signature database and associated with a failing prototype chip) are considered a match when the suspect component(s) (i.e., the general location) and the test results, as defined above, are the same. Such a signature match will be indicative of a given failing production chip having the same systematic defect and, thereby the same root cause as a given failing prototype chip. For example, a signature match can indicate a short at the same specific location or a void at the same specific location. Such a signature match may indicate, for example, that control settings on a tool are incorrect or have drifted and that in-line advance process control (APC) is warranted. For example, a short at a specific location may be known to occur when specific lithographic settings are used at a particular design level. Thus, a short occurring at that specific location on a failing production chip may be an indication that the optimal lithographic settings were not used to manufacture the failing production chip. Thus, if a signature match is found, in-line advanced process control (APC) including, for example, tool setting adjustments or other suitable APC, can be performed in order to prevent the occurrence of the systematic defect at issue in subsequently manufactured production chips.

As mentioned above, the root causes 220 for the systematic defects that are set forth in the fail signature database 200 of FIG. 2 may initially be hypothesized at process 108. The hypothesized root causes will be relatively accurate given the known variations in the lithographic process specifications associated with the failing prototype chips having the systematic defects as compared to the lithographic process specifications associated with passing prototype chips and, thus, the actions taken at processes 112-114 can be performed without having to wait for the results of full root cause failure analyses. However, optionally, root cause failure analyses can still be performed on at least some of the prototype chips to confirm the corresponding root causes for the systematic defects hypothesized at process 108 and stored in the fail signature database (110). In this case, the fail signature database 200 can be updated, as necessary, to reflect more accurate corresponding root causes and can then be used before, during and/or after subsequent production runs in the same manner as described above with respect to processes 112-115.

Aspects of the disclosed method may be implemented using a computer system and computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may incorporate copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the disclosed method are described herein with reference to flowchart illustrations and/or block diagrams. It will be understood that at least some the blocks of the flowchart illustrations and/or block diagrams can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein is an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which has one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 6:
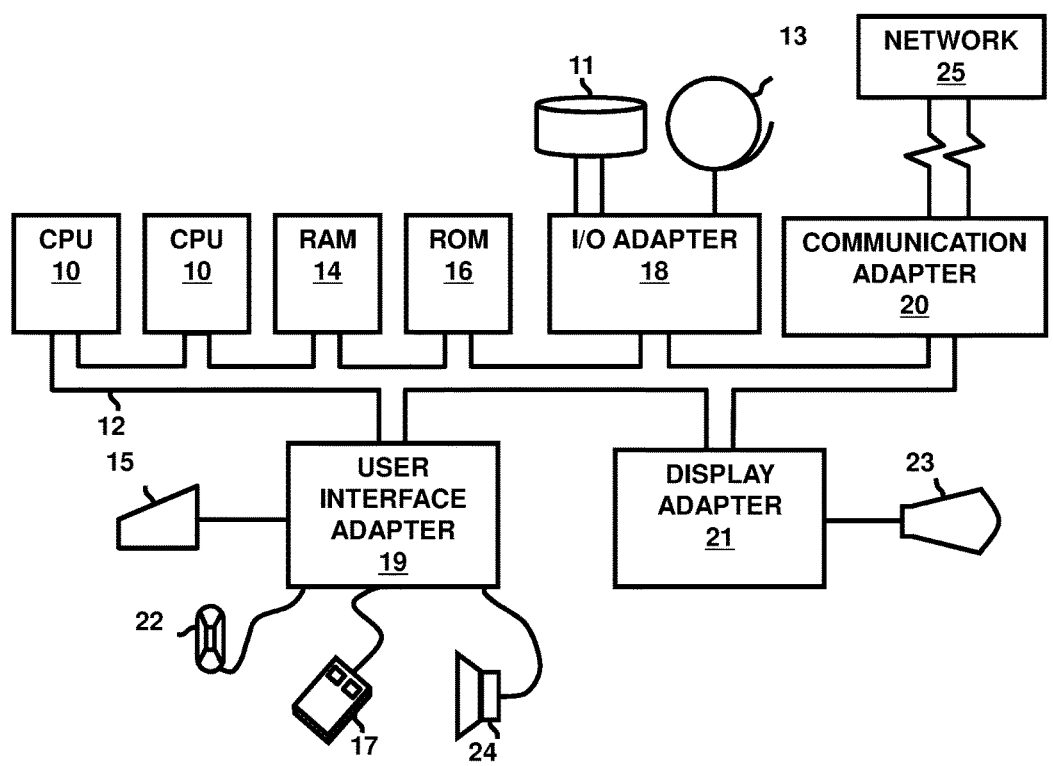
FIG. 6 is a schematic drawing illustrating an exemplary computer system for implementing aspects of the disclosed methods.

A representative hardware environment (i.e., a computer system) for implementing aspects of the disclosed method is depicted in FIG. 6. This schematic drawing illustrates a hardware configuration of an information handling/computer system in accordance with the embodiments herein. The system includes at least one processor or central processing unit (CPU) 10. The CPUs 10 are interconnected via a system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the terminology used herein is for the purpose of describing the disclosed method and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above is a method that provides for early development and, particularly, pre-production run development of a fail signature database, which stores fail signatures for systematic defects found on prototype chips along with corresponding root causes of those systematic defects. The fail signatures in the fail signature database can subsequently be accessed and used for a variety of purposes. For example, the fail signatures can be evaluated and, based on the results of the evaluation, actions can be taken to prevent specific systematic defects from occurring during production runs (e.g., design and/or process specification adjustments can be made) and/or actions can be taken to allow for early detection of specific systematic defects during production runs (e.g., in-line level-specific inspections can be performed). Furthermore, following production runs, new fail signatures from failing production chips can be developed and compared against the fail signatures in the fail signature database. In this case, a signature match can be indicative of a particular production chip having a same systematic defect with a same root cause as a particular prototype chip and, based on such a signature match, in-line advanced process control (APC) can be performed.

What is claimed is:

1. A method for fail signature database development and use during chip manufacturing, the method comprising:
developing a fail signature database, the fail signature database storing fail signatures and corresponding root causes associated with systematic defects, the systematic defects being previously identified on failing prototype chips manufactured according to a specific design and the corresponding root causes being determined given different process specifications used to form at least some of the prototype chips; and
using the fail signature database for detection of one or more specific systematic defects in the production chips, wherein production chips are subsequently manufactured according to the specific design and using a particular set of process specifications;
wherein the using of the fail signature database comprises:
after the developing of the fail signature database, manufacturing the production chips;
identifying failing production chips;
developing new fail signatures for systematic defects on the failing production chips; and
comparing the new fail signatures to the fail signatures in the fail signature database to find signatures matches, each signature match being indicative of a given failing production chip having a same systematic defect with a same root cause as a given failing prototype chip;
further comprising, based on the signature match, performing in-line advanced process control.

2. The method of claim 1, further comprising using the fail signature database for prevention of at least one systematic defect by evaluating the fail signatures in the fail signature database and, based on results of the evaluating, adjusting any of the specific design and the process specifications in the particular set of process specifications to prevent occurrence, in the production chips, of at least one specific systematic defect corresponding to at least one specific fail signature in the fail signature database.

3. The method of claim 1, wherein the using of the fail signature database comprises evaluating the fail signatures and, based on results of the evaluating, performing at least one level-specific inspection during manufacturing of the production chips to detect at least one specific systematic defect corresponding to at least one specific fail signature in the fail signature database.

4. The method of claim 1, further comprising performing root cause analyses to confirm the corresponding root causes for at least some of the systematic defects.

5. The method of claim 1, wherein the process specifications in the particular set of process specifications comprise lithographic process specifications.

6. A method for fail signature database development and use during chip manufacturing, the method comprising:
developing a fail signature database, the developing comprising:
manufacturing prototype chips according a specific design and such that different process specifications are used to form at least some of the prototype chips;
identifying failing prototype chips with systematic defects;
developing fail signatures for the systematic defects, each fail signature indicating test results associated with a particular systematic defect on a particular failing prototype chip;
hypothesizing corresponding root causes for the systematic defects, the particular systematic defect having a root cause that is hypothesized based on the test results and on specific process specifications used to form the particular failing prototype chip; and
storing the fail signatures with the corresponding root causes in the fail signature database; and
using the fail signature database for detection of one or more specific systematic defects in production chips, wherein the production chips are subsequently manufactured according to the specific design and using a particular set of process specifications;
wherein the using of the fail signature database comprises:
after the developing of the fail signature database, manufacturing the production chips;
identifying failing production chips;
developing new fail signatures for systematic defects on the failing production chips; and
comparing the new fail signatures to the fail signatures in the fail signature database to find signatures matches, each signature match being indicative of a given failing production chip having a same systematic defect with a same root cause as a given failing prototype chip;
further comprising, based on the signature match, performing in-line advanced process control.

7. The method of claim 6, further comprising using of the fail signature database to prevent at least one specific defect by evaluating the fail signatures in the fail signature database and, based on results of the evaluating, adjusting any of the specific design and the process specifications in the particular set of process specifications to prevent occurrence in the production chips of at least one specific systematic defect corresponding to at least one specific fail signature in the fail signature database.

8. The method of claim 6, wherein the using of the fail signature database comprises evaluating the fail signatures and, based on results of the evaluating, performing at least one level-specific inspection during manufacturing of the production chips to detect at least one specific systematic defect corresponding to at least one specific fail signature in the fail signature database.

9. The method of claim 6, further comprising performing root cause analyses to confirm the corresponding root causes for the systematic defects.

10. The method of claim 6, wherein the process specifications in the particular set of process specifications-comprises lithographic process specifications.

11. A method for fail signature database development and use during chip manufacturing, the method comprising:
  developing a fail signature database, the developing comprising:
    manufacturing prototype chips according a specific design and, during the manufacturing of the prototype chips, performing at least one lithography learning technique such that, for each of multiple selected design levels, different lithographic process specifications are used to form at least some of the prototype chips, the at least one lithography learning technique comprising focus exposure matrix development, process window qualification and process window centering;
    identifying failing prototype chips with systematic defects;
    developing fail signatures for the systematic defects, each fail signature indicating test results associated with a particular systematic defect on a particular failing prototype chip;
    hypothesizing corresponding root causes for the systematic defects, the particular systematic defect having a root cause that is hypothesized based on the test results and on specific lithographic process specifications used during formation of a particular design level that is on the particular failing prototype chip and that contains the particular systematic defect; and
    storing the fail signatures with the corresponding root causes in the fail signature database; and
  using the fail signature database detection of one or more specific systematic defects in production chips, wherein the production chips are subsequently manufactured according to the specific design and using a particular set of process specifications;
  wherein the using of the fail signature database comprises:
    after the developing of the fail signature database, manufacturing the production chips;
    identifying failing production chips;
    developing new fail signatures for systematic defects on the failing production chips; and comparing the new fail signatures to the fail signatures in the fail signature database to find signatures matches, each signature match being indicative of a given failing production chip having a same systematic defect with a same root cause as a given failing prototype chip;
    further comprising, based on the signature match, performing in-line advanced process control.

12. The method of claim 11, further comprising using the fail signature database for prevention of at least one specific defect by evaluating the fail signatures in the fail signature database and, based on results of the evaluating, adjusting any of the specific design and the process specifications in the particular set of process specifications to prevent occurrence in the production chips of at least one specific systematic defect corresponding to at least one specific fail signature in the fail signature database.

13. The method of claim 11, wherein the using of the fail signature database comprises evaluating the fail signatures and, based on results of the evaluating, performing at least one level-specific inspection during manufacturing of the production chips to detect at least one specific systematic defect corresponding to at least one specific fail signature in the fail signature database.

14. The method of claim 11, further comprising performing root cause analyses to confirm the corresponding root causes for the systematic defects.

* * * * *